(12) United States Patent
Yu et al.

(10) Patent No.: US 7,738,498 B1
(45) Date of Patent: Jun. 15, 2010

(54) SHARING A DIGITAL PHASE-LOCKED LOOP ACROSS MULTIPLE PACKET STREAMS

(75) Inventors: James J. Yu, San Jose, CA (US); Andrew C. Yang, Sunnyvale, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1345 days.

(21) Appl. No.: 11/199,627

(22) Filed: Aug. 9, 2005

(51) Int. Cl.
*H04J 3/06* (2006.01)

(52) U.S. Cl. .................... 370/503; 375/376; 375/215

(58) Field of Classification Search ........... 370/216, 370/229, 235, 242, 249, 389, 392, 394, 395.7–395.72, 370/471, 473–475, 503, 508, 509, 512, 516–519; 709/226; 714/699–704, 798, 799; 375/358, 375/373–376, 215
See application file for complete search history.

(56) References Cited

U.S. PATENT DOCUMENTS

| | | | |
|---|---|---|---|
| 5,465,059 A * | 11/1995 | Pan et al. ....................... 327/12 |
| 5,553,021 A | 9/1996 | Kubono et al. | |
| 6,347,119 B2 * | 2/2002 | Matsumura et al. .... 375/240.28 |
| 6,426,972 B1 * | 7/2002 | Endres et al. ................ 375/229 |
| 6,647,017 B1 * | 11/2003 | Heiman ....................... 370/412 |
| 6,754,241 B1 | 6/2004 | Krishnamurthy et al. | |
| 7,289,538 B1 * | 10/2007 | Paradise et al. ............. 370/497 |
| 2003/0185238 A1 * | 10/2003 | Strasser et al. .............. 370/473 |
| 2003/0189953 A1 * | 10/2003 | Matsumura et al. ......... 370/503 |

OTHER PUBLICATIONS

"Narrowcast Services Gateway™"; printed from the internet: www.harmonicinc.com/view_csd_product_group.cfm?classID=1040; 2 pages.
"Narrowcast Services Gateway™ NSG 8000 Family"; printed from the internet: www.harmonicinc.com/stageone/files/harmonic/collateral/NSG%F8000%5Ffamily%5Fv05%2DO2%5FRS%2Epdf; 4 pages.
"Narrowcast Services Gateway™ NSG Family"; printed from the internet: www.harmonicinc.com/stageone/files/harmonic/collateral/NSG%Fv03%2D09%FRS%2Epdf; 4 pages.

(Continued)

*Primary Examiner*—Aung S Moe
*Assistant Examiner*—Curtis A Alia
(74) *Attorney, Agent, or Firm*—Meyertons Hood Kivlin Kowert & Goetzel, P.C.; Jeffrey C. Hood; Mark K. Brightwell

(57) ABSTRACT

A system including a memory (storing a set of data records), a digital phase-locked loop (PLL) and digital circuitry. Each of the data records is allocated to one packet stream in a set of packet streams. The digital circuitry is configured to: invoke a read operation from the memory in response to a received stream indicator and received channel indicator corresponding to a current timestamp-bearing packet; generate an output timestamp for the current packet equal to an expected timestamp provided by the memory as part of the read operation; and generate error data based on argument data including a received input timestamp, a received slot delay value, a previous source frequency estimate and an expected timestamp provided as part of the read operation. The digital PLL is configured to compute an updated source frequency estimate based on information including the error data and the previous source frequency estimate.

20 Claims, 8 Drawing Sheets

OTHER PUBLICATIONS

"Model D9479 Gigabit QAM Modulator"; Scientific Atlanta; printed from the internet: www.sciatl.com/customers/Source/4005270.pdf; 3 pages.

"SEM SmartStream Encryptor Modulator"; Motorola; printed from the internet: http://broadband.motorola.com/catalog/product_documents/SEM_nov02.pdf; 2 pages.

"CISCO UMG9850 QAM Module"; printed from the internet: www.cisco.com/en/US/products/hw/video/ps5648/5649/; 2 pages.

"Cisco uMG9850 QAM Module Data Sheet"; printed from the internet: http://www.cisco.com/warp/public/cc/pd/mxsv/prodlit/9850d_ds.pdf; Cisco uMG9850 QAM Module; 4 pages.

Didier Le Gall; "MPEG: A Video Compression Standard for Multimedia Applications"; Communications of the ACM; Apr. 1991; pp. 47-58; vol. 34, No. 4.

"DTA-120—DVB/ASI Input Adapter for PCI Bus"; Jul. 2003; 30 pages; DekTec Digital Video B.V.; Retrieved from the Internet: http://www.dektec.com/Products/DTA-120/Downloads/DTA-120.pdf.

* cited by examiner

SHARING A DIGITAL PHASE-LOCKED LOOP ACROSS MULTIPLE PACKET STREAMS

BACKGROUND OF THE INVENTION

1. Field of the Invention

This invention is related to the field of digital data multiplexing, and, more particularly, to the field of digital logic design.

2. Description of the Related Art

A digital source device may generate a stream of packets for transmission to a digital sink device. The packets may contain information that requires action by the sink device at certain times. Thus, the source device may embed timestamps into the packet stream so that the sink device can synchronize with the clock in the source device. However, the transmission time between the source device and the sink device may vary from one packet to the next of the packet stream, especially when the packet stream is multiplexed with other packet streams onto the same channel or data path. The variation in packet transmission time may make it difficult for the sink device to lock onto the source clock frequency associated with the packet stream. Thus, there exists a need for systems and devices capable of operating on the packet stream in a way that minimizes the variation of apparent source clock frequency as seen by the data sink. Furthermore, there exists a need for systems and devices capable of multiplexing a plurality of packet streams in a way that minimizes the apparent source clock frequency variation as seen by respective data recipients.

SUMMARY

In one set of embodiments, a system may include a memory, a digital phase-locked loop (PLL), an error calculation unit, an output timestamp generator and a control unit. The memory may be configured to store a set of data records. Each of the data records may be allocated to one packet stream in a set of packet streams. The control unit may be configured to:
   receive a channel indicator and a stream indicator for a current timestamp-bearing packet,
   generate an address based on the stream indicator and the channel indicator, and
   invoke a read operation from the memory based on the address.

The output timestamp generator may be configured to:
(a) generate an output timestamp for the current packet equal to an expected timestamp provided by the memory as part of said read operation, and
(b) compute a delay count for the current packet based on a previous source frequency estimate provided by the memory as part of said read operation and on a received slot delay value.

The error calculation unit may be configured to generate an error value and an error gradient value based on the delay count, the expected timestamp, an input timestamp and a previous error value provided by the memory as part of said read operation.

The digital PLL may be configured to compute an updated source frequency estimate in response to receiving the error value, the error gradient value and the previous source frequency estimate.

The system may also include an update unit. The update unit may be configured to receive a channel indication for each packet in a sequence of packets including the current timestamp-bearing packet. The packets of the sequence belong to the set of packet streams. The update unit may be further configured to perform, for each packet of the sequence of packets, operations including the following:
   reading from the memory an expected timestamp and a respective source frequency estimate corresponding to the channel indication, and
   updating the expected timestamp based on the respective source frequency estimate.

The error calculation unit may be configured to store the error value in the memory in order to update the previous error value.

The slot delay value may represent a number of packet transmission slots that the packet has been delayed. The output timestamp generator may be configured to compute the delay count by multiplying the slot delay value and the previous source frequency estimate.

As an alternative to (a), the output timestamp generator may be configured to generate the output timestamp by adding the delay count to the input timestamp in response to an indication that the current timestamp-bearing packet corresponds to a stream discontinuity.

The digital PLL may include a set of low-pass digital filters that operate on the error value and the error gradient value. The set of digital filters may include:
   a first infinite impulse response (IIR) filter that operates on the error value and on
   a first previous output value provided as part of said read operation, to generate a first updated output value; and
   a set of two or more second IIR filters that operate on the error gradient value and on a set of second previous output values provided as part of said read operation, respectively, to generate second updated output values, respectively.

The digital PLL may be configured to compute the updated source frequency estimate by:
   selecting one of the second updated output values based on a decision count value;
   computing a clock adjustment value based on the first output value and the selected one of the second updated output values; and
   adding the clock adjustment value to the previous source frequency estimate.

The decision count value may represent a number of timestamp bearing packets associated with a current packet stream to which the current packet belongs.

The control unit may be configured to reinitialize the data record corresponding to the address in response to a received indication that the current packet corresponds to a stream discontinuity.

The digital PLL may be configured to write the updated source frequency estimate to the memory, into the data record corresponding to the address.

In another set of embodiments, a system may include a memory, a digital phase-locked loop (PLL) and digital circuitry. The memory may be configured to store a set of data records. Each of the data records is allocated to one packet stream in a set of packet streams. The digital circuitry may be configured to:
   invoke a read operation from the memory in response to a received stream indicator and received channel indicator corresponding to a current timestamp-bearing packet;
   generate an output timestamp for the current packet equal to an expected timestamp provided by the memory as part of said read operation; and
   generate error data based on first data including a received input timestamp, a received slot delay value, a previous source frequency estimate and an expected timestamp provided by the memory as part of said read operation.

The digital PLL may be configured to compute an updated source frequency estimate based on information including the error data and the previous source frequency estimate.

The system may also include an update unit. The update unit may be configured to receive a channel indication for each packet in a sequence of packets including the current timestamp-bearing packet. The packets of the sequence belong to the set of packet streams. The update unit may be further configured to perform, for each packet of the sequence of packets, operations including the following:

reading from the memory an expected timestamp and a respective source frequency estimate corresponding to the channel indication, and updating the expected timestamp based on the respective source frequency estimate.

The digital logic may be configured to alternatively generate the output timestamp by adding a delay count to the input timestamp in response to an indication that the current timestamp-bearing packet corresponds to a stream discontinuity. The delay count may be computed as a product of the expected timestamp and the slot delay value.

The digital PLL may include a set of one or more low-pass digital filters.

The error data may include an error value and an error gradient value, and, the first data may also include a previous error value provided by the memory as part of said read operation.

The set of digital filters may include:

a first infinite impulse response (IIR) filter that operates on the error value and on a first previous output value provided as part of said read operation, to generate a first updated output value; and a set of two or more second IIR filters that operate on the error gradient value and on a set of second previous output values provided as part of said read operation, respectively, to generate second updated output values, respectively.

The digital PLL may be configured to compute the updated source frequency estimate by:

selecting one of the second updated output values based on a decision count value;

computing a clock adjustment value based on the first output value and the selected one of the second updated output values;

adding the clock adjustment value to the previous source frequency estimate.

BRIEF DESCRIPTION OF THE FIGURES

The following detailed description makes reference to the accompanying drawings, which are now briefly described.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning "having the potential to"), rather than the mandatory sense (i.e., meaning "must"). The phrase "A includes B" is to be interpreted as "A includes B, but is not limited to B".

DETAILED DESCRIPTION OF PREFERRED EMBODIMENTS

The following is a list of acronyms used herein.

dB=decibels

FIFO=first-in first-out buffer

FIR=finite impulse response hr=hour

Hz=Hertz (i.e., cycles per second)

IIR=infinite impulse response

MHz=Megahertz

MPEG=moving picture experts group

μs=microseconds ns=nanoseconds

PCR=Program Clock Reference

PLL=phase locked loop ppm=parts per million

SNR=signal-to-noise ratio

Figure 1:
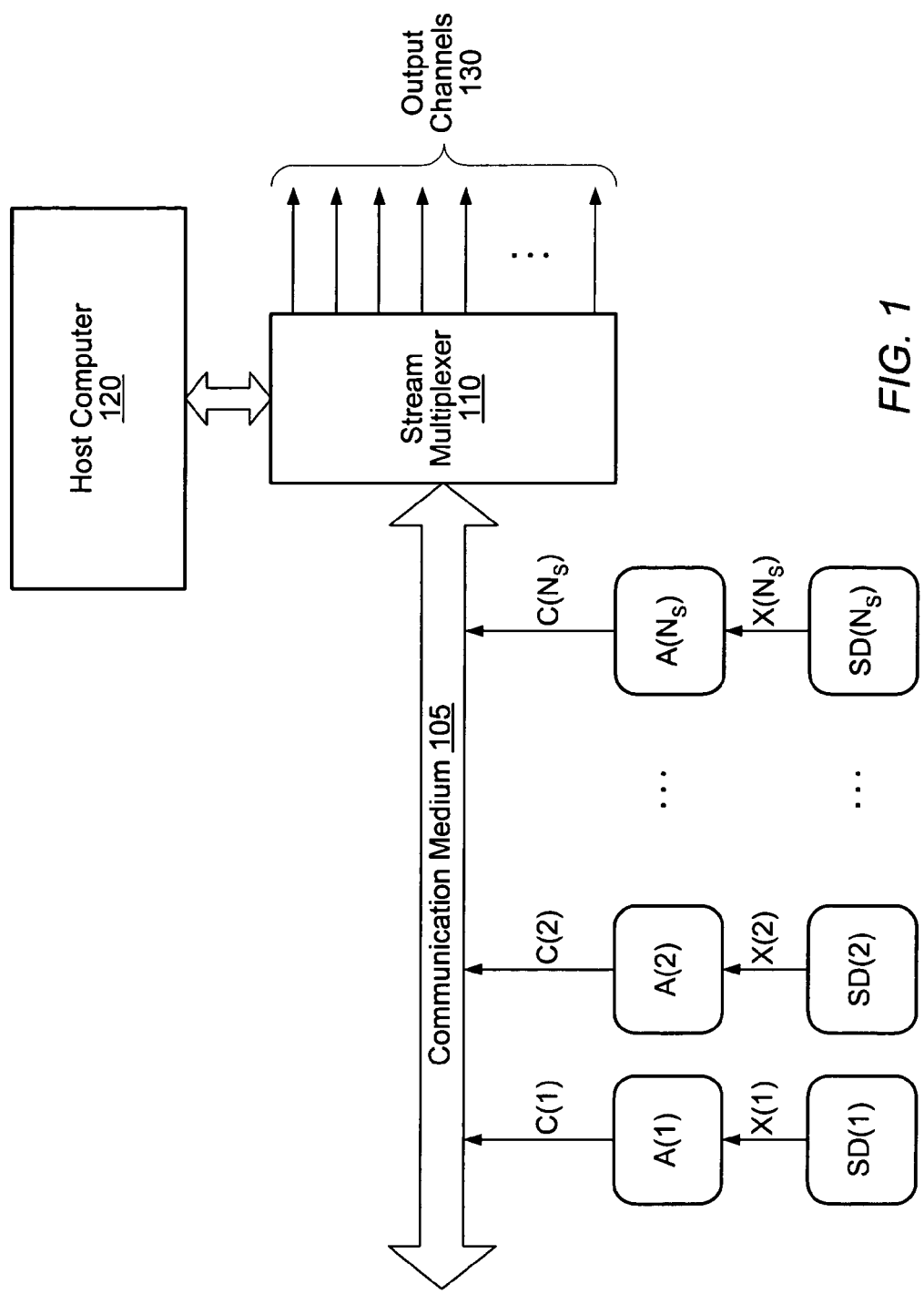
FIG. 1 illustrates a system for distributing packet streams from a set of source devices to a set of output channels.

Source devices SD(1), SD(2), . . . , SD($N_S$), where $N_S$ is a positive integer, may be configured to generate packet streams X(1), X(2), . . . , X($N_S$), respectively, as suggested by FIG. 1.

Each source device SD(k), k=1, 2, . . . , $N_S$, may be configured to inject timestamps into at least a subset of the packets of stream X(k). (A packet that contains a timestamp is said to be a timestamp-bearing packet.) To support this timestamping operation, each source device SD(k) may include its own source clock and source counter which is driven by the source clock. Source device SD(k) may derive a timestamp for a packet by reading the value of a source counter. Let $f_S(t,k)$ denote the frequency of the source clock in source device SD(k) at time t. This notation acknowledges that the source clock frequency of any given source device SD(k) is not constant but varies with respect to time (e.g., due to temperature variations). Furthermore, the source clocks in the source devices will generally have different frequencies within a specified tolerance, even when the source clocks are designed to have the same nominal frequency.

Source device SD(k), k=1, 2, . . . , $N_S$, may transmit the stream X(k) to a transfer device A(k).

In one set of embodiments, the source devices SD(1), SD(2), ..., SD($N_S$) may be encoders (e.g., MPEG-2 encoders) and the packet streams X(1), X(2), ..., X($N_S$) may be MPEG-2 transport streams as defined in the ISO/IEC 1381-1 specification for MPEG-2. In these embodiments, the timestamps are referred to as program clock reference (PCR) timestamps. The transfer devices A(1), A(2), ..., A($N_S$) may be Ethernet interfaces, however, other types of interfaces may be used as well.

Transfer device A(k) may be configured to:
receive the stream X(k),
embed the packets of the stream X(k) into a sequence C(k) of data units (e.g., Internet Protocol datagrams), and
transfer the sequence C(k) of data units to a stream multiplexer 110 through a communication medium 105.
Each data unit may include a number of packets.

In one set of embodiments, the communication medium 105 is an Ethernet segment (e.g., a 10 Gigabit Ethernet segment). However, it is contemplated that other technologies may be used to realize the communication medium.

The communication medium 105 may be configured according to a protocol that allows only one agent to communicate at any given time. Thus, the stream multiplexer 110 may receive (from the communication medium 105) a composite sequence of data units representing a time-multiplexed mixture of the data units of the sequences C(1), C(2), ..., C(Ns).

The stream multiplexer 110 is configured for coupling to the communication medium 105 and to a set of output channels 130 as illustrated in FIG. 1.

The stream multiplexer 110 buffers, multiplexes, and de jitters subsets of the streams X(1), X(2), ..., X($N_S$) onto respective ones of the output channels 130. In other words, a first subset of the streams are combined to form a first output stream which is transmitted onto a first of the output channels; a second subset of the streams are combined to form a second output stream which is transmitted onto a second of the output channels; and so forth.

In one set of embodiments, the output channels 130 are quadrature amplitude modulation (QAM) channels. However, it is contemplated that other technologies may be used to realize the output channels.

Each of the output channels 130 may couple to a number of data sinks (not shown). The data sinks may be (or may include) MPEG-2 decoders.

Each data sink may be configured to (a) receive the multiplexed output stream from the output channel to which it is coupled and (b) extract packets corresponding to one or more selected packet streams from the multiplexed output stream. Furthermore, each data sink may include a phase-locked loop (PLL) based in hardware or software. For each of the selected packet streams, the PLL may attempt to track the frequency of the source clock corresponding to the selected packet stream using the timestamps embedded in the selected packet stream. However, if the jitter in the transmission time (between the source device and the data sink) for the selected packet stream is too great, or the transmission frequency is incorrect, the software PLL may not be able to lock onto the source clock frequency. This inability to lock onto the source clock frequency may have adverse effects such as improper decoding or loss of picture. Thus, stream multiplexer 110 may be configured to:
apply a more robust hardware-based methodology for tracking the source clock frequency of each of the streams X(1), X(2), ..., X($N_S$), and
use the estimated source clock frequencies (which are generated and periodically updated by said hardware-based tracking methodology) to restamp packets as they are being sent out onto the output channels 130.

In some embodiments, the stream multiplexer 110 may be used to supply video on demand to users. For example, a set of users whose decoder boxes are coupled to a given output channel may select respective programs they are interested in viewing from a set of available programs (e.g., movies). The stream multiplexer 110 may be configured to multiplex the streams (e.g., the MPEG-2 transport streams) representing the selected programs onto the given output channel. Each user's decoder box may extract the packets of one or more selected packet streams from the multiplexed output stream and generate one or more video streams from the extracted packets. The video stream may be used to drive a display device (such as a television, a projector, a head mounted display, a computer display, etc.) which is coupled to the decoder box.

The stream multiplexer 110 may be configured for coupling to a host computer 120. The host computer may be configured to execute software that performs control and management functions such as initialization, error reporting, etc.

Figure 2A:
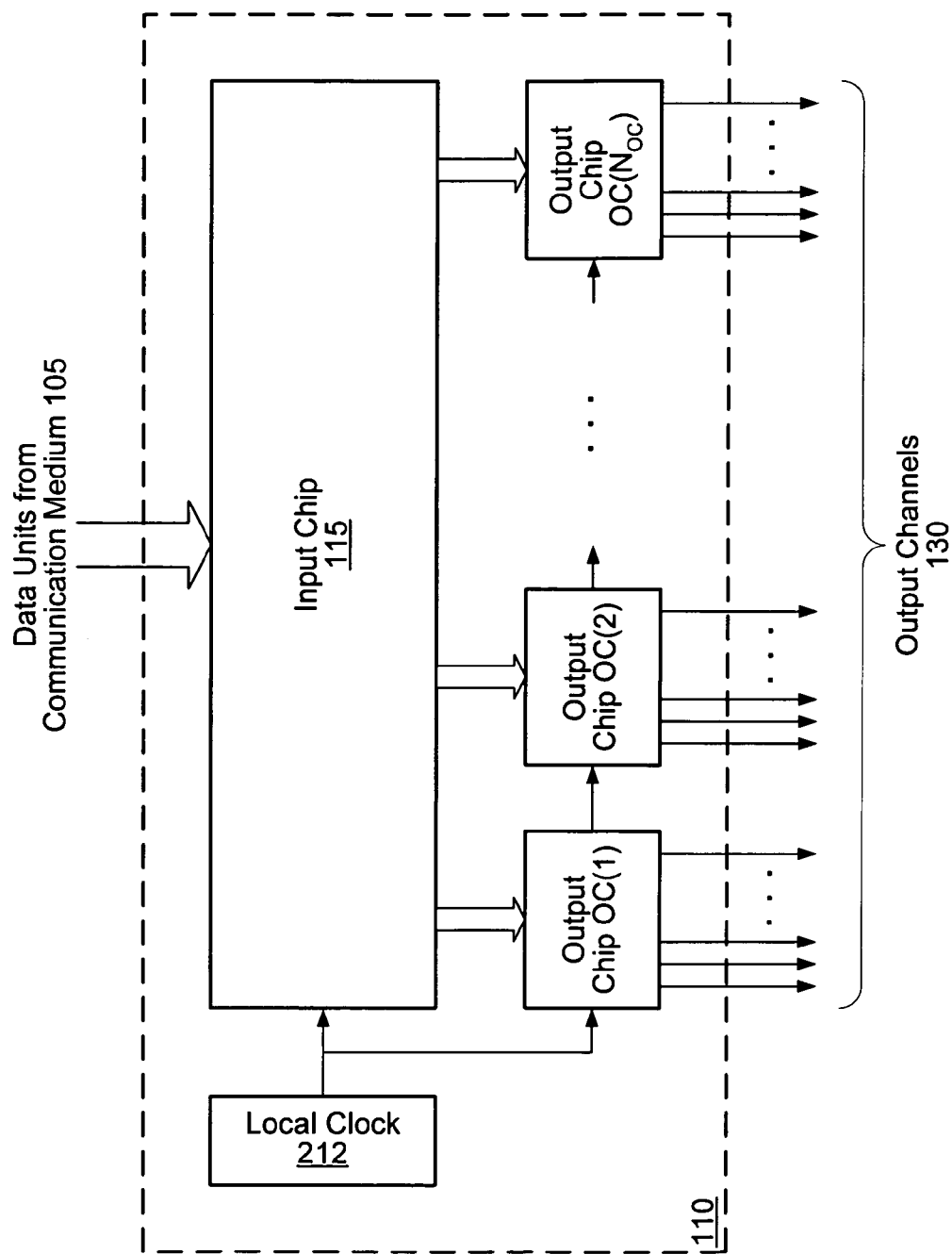
FIG. 2A illustrates one set of embodiments of stream multiplexer 110.

FIG. 2A is a block diagram of the stream multiplexer 110 according to one set of embodiments. The stream multiplexer 110 may include:
an input chip 115,
a set of output chips OC(1), OC(2), ..., OC($N_{OC}$), where $N_{OC}$ is a positive integer, and
a local clock 212.

The number $N_{OC}$ of output chips may vary among different embodiments. In one embodiment, $N_{OC}$ equals 4. In another embodiment, $N_{OC}$ equals 8.

In one set of embodiments, the local clock 212 and the source clocks (used by the source devices) may have the same nominal frequency (e.g., 27 MHz). However, the local clock 212 may be more accurate than the source clocks. In one embodiment, the local clock 212 is a 27 MHz clock with an accuracy of +−3 ppm.

The input chip 115 receives a composite sequence of data units representing a time-multiplexed mixture of the data units of sequences C(1), C(2), ..., C($N_S$). Furthermore, the input chip 115 extracts the packets of the packet streams X(1), X(2), ..., X($N_S$) from the data units of the composite sequence and transfers each of the packet streams to one (or alternatively, one or more) of the output chips OC(1), OC(2), OC($N_{OC}$). The assignment of packet streams to output chips is programmable (e.g., by control software executing on host computer 120).

Each output chip OC(n), n=1, 2, ..., $N_{OC}$, is configured to receive packets corresponding to one or more of the packet streams X(1), X(2), ..., X($N_S$) and to transmit each of the received packet streams onto one of its output channels. The assignment of packets streams to output channels is programmable (e.g., by the control software executing on host computer 120).

Figure 2B:
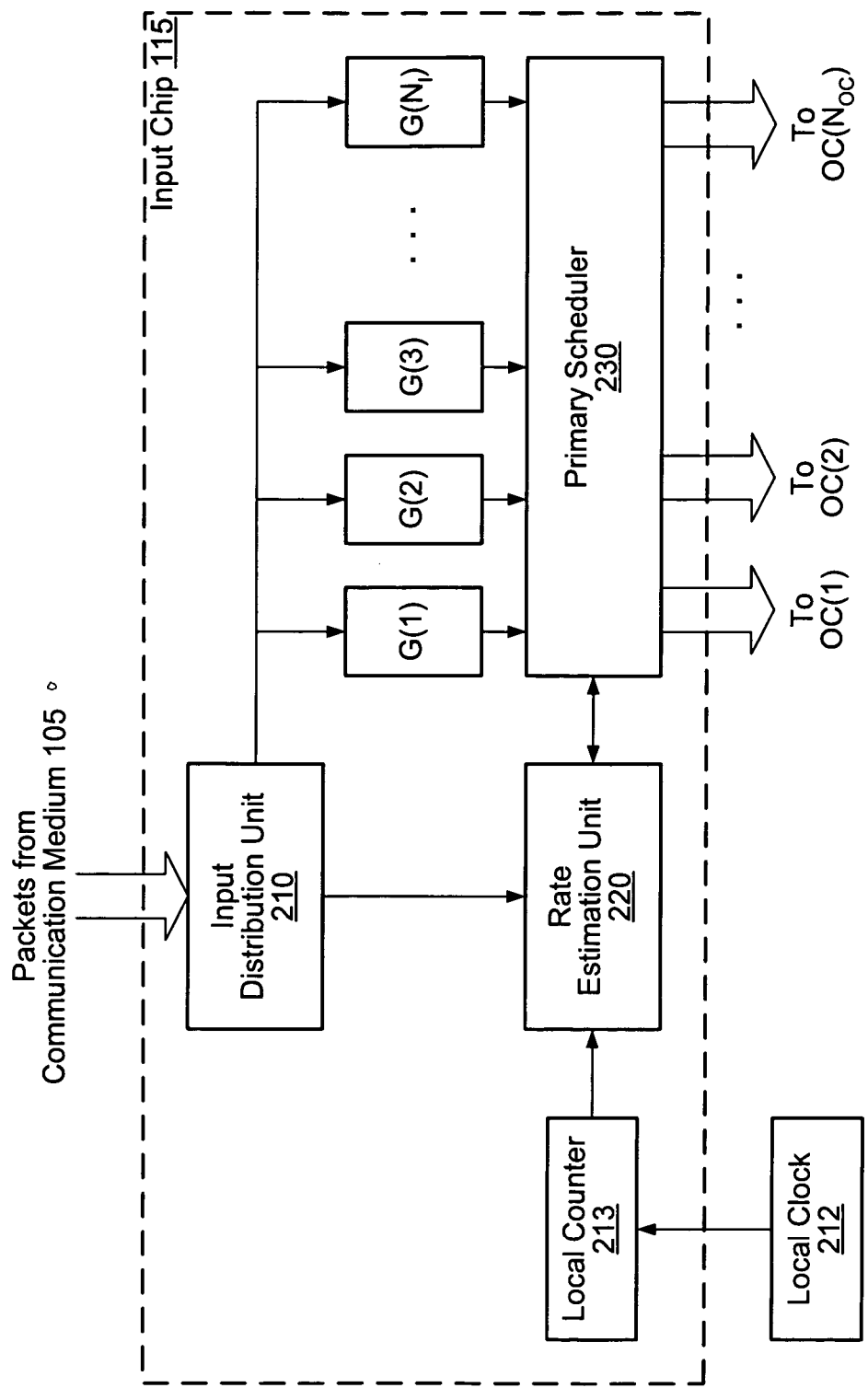
FIG. 2B illustrates one set of embodiments of an input chip of the stream multiplexer 110.

FIG. 2B is a block diagram of input chip 115 according to one set of embodiments.

The input chip 115 may include:
an input distribution unit 210;
a rate estimation unit 220;
a set of $N_I$ stream FIFOs denoted as G(1), G(2), ..., G($N_I$), wherein $N_I$ is greater than one; and
a primary scheduler 230.

A wide variety of values are contemplated for the number $N_I$. In one particular embodiment, $N_I$ equals 4096.

The input distribution unit 210:

receives the composite sequence of data units from the communication medium 105;

examines each received data unit, determines the stream X(k) to which the data unit belongs (e.g., based on information embedded in the header of the data unit);

extracts packets from the data unit; and stores the extracted packets into one of the stream FIFOs G(1), G(2), ..., G($N_I$), i.e., the stream FIFO that has been allocated to stream X(k).

When a new stream is encountered, an available one of the stream FIFOs may be allocated to the new stream. When an existing stream is concluded, the stream FIFO that has been allocated to that stream may be deallocated and returned to the available list.

The primary scheduler 230 is configured to read packets from the stream FIFOs G(1), G(2), ..., G($N_I$) and transfer the packets to the output chips OC(1), OC(2), OC($N_{OC}$). In one set of embodiments, the packets from each stream FIFO are transferred into a corresponding one of the output chips. The host computer 120 may provide control information which specifies a function f from the set $\{1, 2, ..., N_I\}$ to the set $\{1, 2, ..., N_{OC}\}$. The packets from stream FIFO G(k), k=1, 2, ..., $N_I$, may be transferred to output chip OC(f(k)). Of course, some of the stream FIFOs may be inactive (i.e., not allocated to a stream). Thus, the domain of the function f may be a proper subset of the set $\{1, 2, ..., N_I\}$.

The rate estimation unit 220 may be configured to estimate the input data rate of each of the packet streams X(1), X(2), ..., X($N_S$), and, based on these data rate estimates, to generate recommended rates at which the stream FIFOs G(1), G(2), ..., G($N_I$) should be drained by the primary scheduler 230. For example, the rate estimation unit 220 may recommend rates that allow the stream FIFOs to stay nominally half full.

The rate estimation unit 220 may couple to input unit 210, local counter 213, and scheduler 230.

Figure 2C:
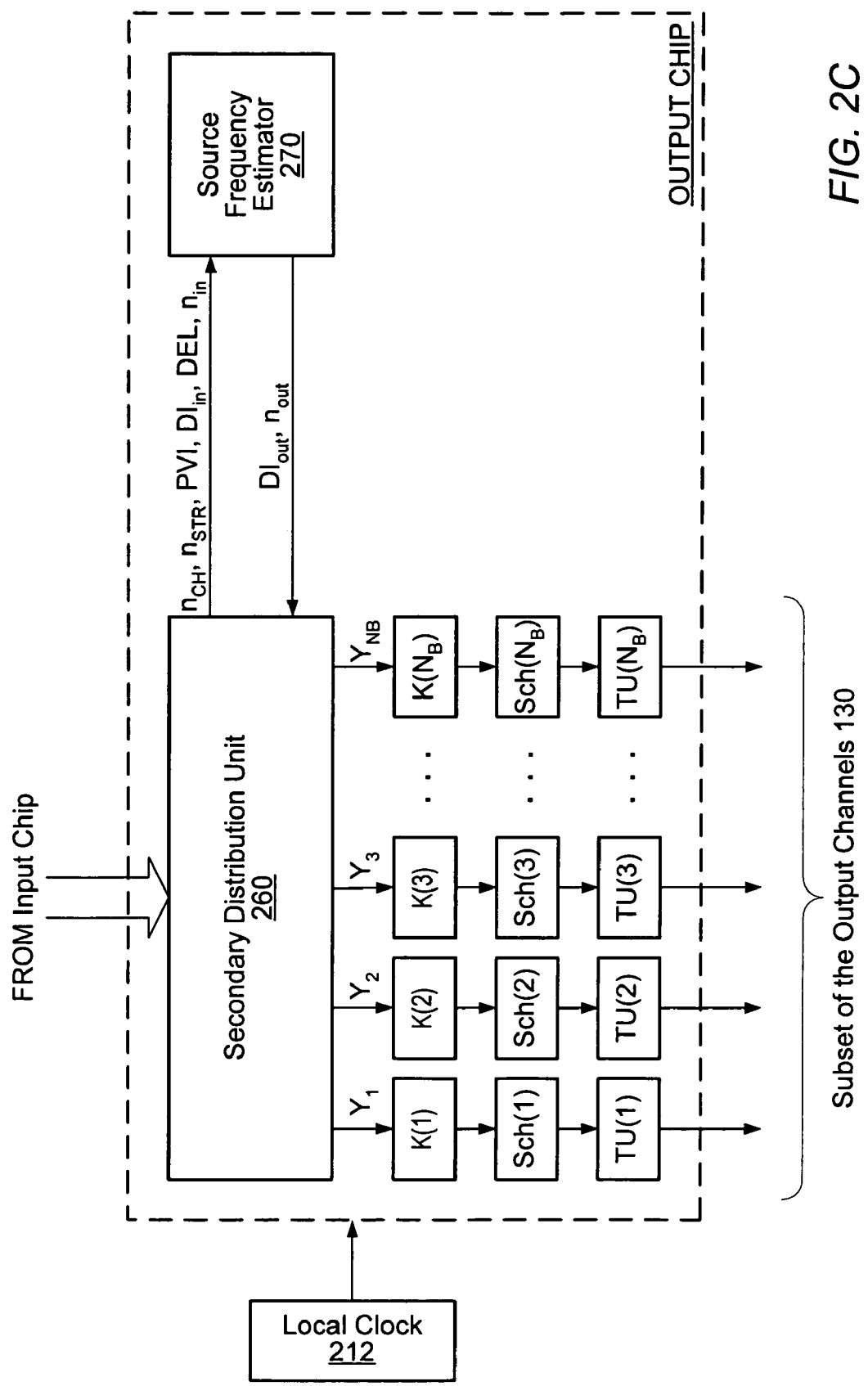
FIG. 2C illustrates one set of embodiments of an output chip of the stream multiplexer 110.

Each output chip OC(n), n=1, 2, ..., $N_{OC}$, may be configured as illustrated in FIG. 2C.

The output chip may include:

a secondary distribution unit 260;

a source frequency estimator 270;

a set of output FIFOs K(1), K(2), ..., K($N_B$), where $N_B$ is a positive integer;

a set of schedulers Sch(1), Sch(2), Sch($N_B$);

a set of transmit units TU(1), TU(2), ..., TU($N_B$); and

Secondary distribution unit 260 receives a mixed stream of packets corresponding to one or more of the packet streams X(1), X(2), ..., X($N_S$) from the input chip 115. The secondary distribution unit 260 distributes the packets of the mixed stream to the output FIFOs based on the packet streams to which the packets belong. Packets in the mixed stream that belong to a first subset of the packet streams may be written into the first output FIFO K(1). Packets in the mixed stream that belong to a second subset of the packet streams may be written into the second output FIFO K(2), and so on. The assignment of packet streams to output FIFOs (and thus, to output channels) may be controlled by the host computer.

The packets written into output FIFO K(n), n=1, 2, ..., $N_B$, form an output stream $Y_n$. Scheduler Sch(n) reads the packets of the output stream $Y_n$ from output FIFO K(n) and supplies these packets to transmit unit TU(n). Transmit unit TU(n) transmits the packets of the output stream $Y_n$ onto a corresponding one of the output channels (e.g., quadrature amplitude modulation channels). Thus, the output chip generates $N_B$ output streams which are transmitted onto $N_B$ output channels respectively.

Each of the output streams $Y_n$ may include up to $N_{S/C}$ packet streams, where $N_{S/C}$ is an integer greater than or equal to two. In other words, up to $N_{S/C}$ packets streams may be multiplexed onto each output channel. In one embodiment, $N_{S/C}$ equals 32.

A wide variety of values are contemplated for the number $N_B$. In one embodiment, $N_B$=32.

The source frequency estimator 270 may be configured to track the source clock frequencies of the packet streams received by the output chip based on the timestamps embedded in these packet streams. Thus, the source frequency estimator 270 may maintain an estimate of the source clock frequency for each of these packet streams.

Figure 3:
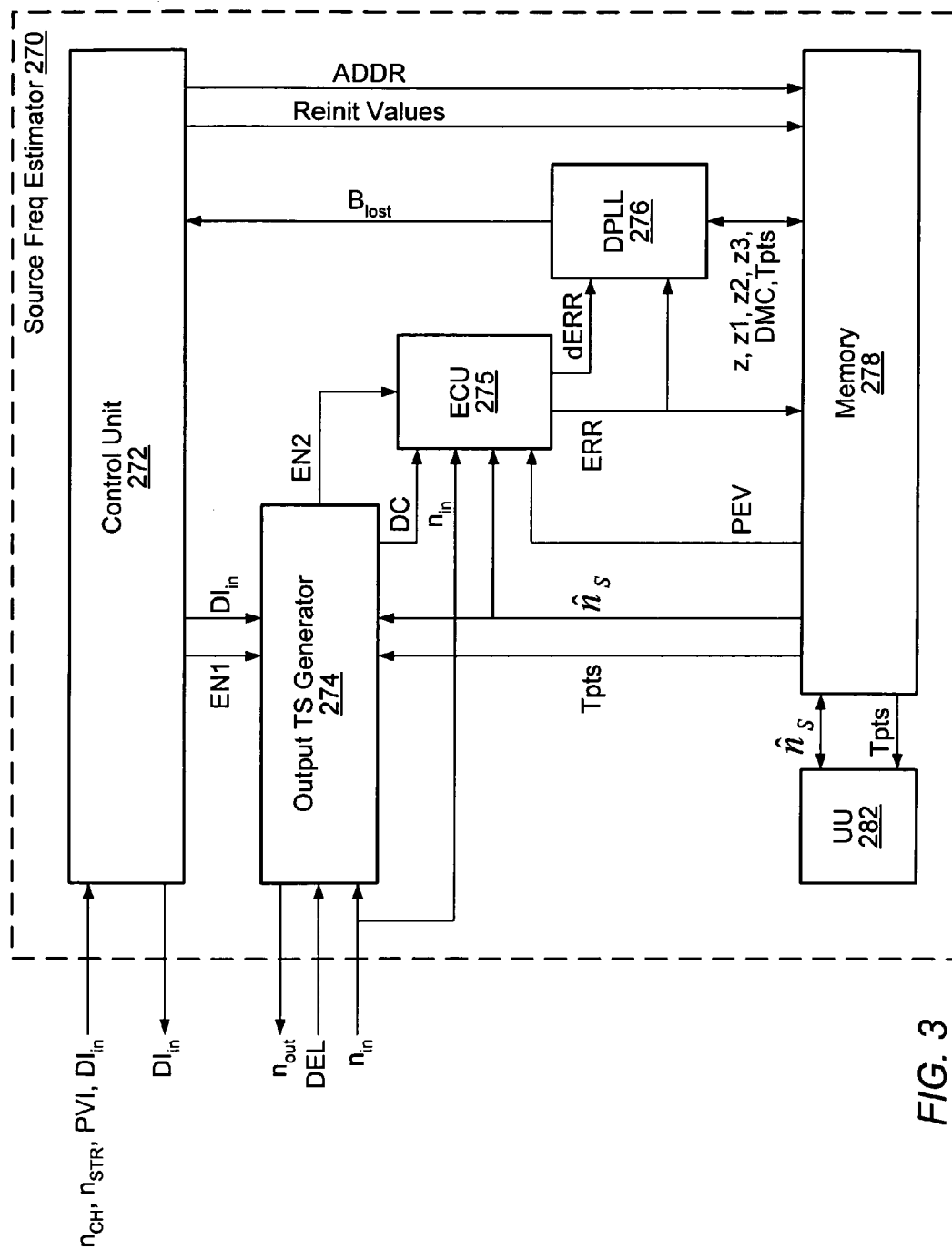
FIG. 3 illustrates one set of embodiments of the source frequency estimator.

As shown in FIG. 3, the source frequency estimator 270 may include:

a control unit 272;

an output timestamp generator 274;

a digital phase-locked loop (PLL) including a set of filters 276;

a memory 278;

a memory access unit 280; and an update unit 282.

The memory 278 includes a set of $N_B$*$N_{S/C}$ data records, i.e., $N_{S/C}$ data records for each of the $N_B$ output channels. Each data record includes data values that are used to track the source clock frequency of a corresponding one of the packet streams. In one set of embodiments, the data record may include:

an expected timestamp $\hat{n}_S$;

values z, $z_1$, $z_2$, $z_3$ to store the outputs generated by the set of filters (of the digital PLL 276);

a previous error value PEV;

a decision multiplexer count DMC which represents a number of timestamp-bearing packets that have been received in the associated packet stream;

a value $T_{pts}$ which represents an estimate of the number of source clock cycles per packet transmission time for the associated packet stream.

Prior to writing a packet P into an output FIFO, the secondary distribution unit 260 may send an update request to the source frequency estimator 270, where the request includes:

a value $n_{CH}$ indicating the output FIFO K($n_{CH}$) to which the packet is to be written;

an value $n_{STR}$ indicating which of the up to $N_{S/C}$ packet streams (that map to the output FIFO K($n_{CH}$)) the packet P is associated with;

an indicator PVI of whether the packet P is valid;

an indicator $DI_{in}$ of whether the packet P corresponds to a discontinuity in the packet stream to which the packet belongs;

a delay value DEL indicating the number of packet transmission slots the packet P has been delayed (in the input chip) relative to its "ideal" transmission slot;

a value $n_{in}$ equal to the timestamp $n_S$ of the packet P if the packet P contains a timestamp and equal to zero if the packet P does not contain a timestamp.

In response to the update request, the source frequency estimator 270 may:

compute an address value ADDR based on the channel value $n_{CH}$ and the stream value $n_{STR}$, e.g., according to the relation $$ADDR = n_{STR} n_{CH} * N_{S/C}, \qquad (1)$$

where the address value ADDR indicates a unique one of the data records in the memory 278;

compute a delay count DC for the packet P according to the relation $$DC = DEL * Tpts(ADDR), \qquad (2)$$

where Tpts(ADDR) denotes the Tpts value associated with the data record identified by the address value ADDR;

generate an output timestamp $n_{out}$ and update the values z, $z_1$, $z_2$, $z_3$, PEV, DMC, Tpts associated with the data record identified by the address value ADDR, in response to a determination that the packet P is valid (i.e., PVI=1) and the packet P is a timestamp-bearing packet (i.e., $n_{in}$ .neq. 0), where .neq. represents the "not equal to" operator;

update the expected timestamp $\hat{n}_S$ for each of the packet streams that are assigned to the output FIFO $K(n_{CH})$ in anticipation of the next packet transmission.

Henceforth, the notation x(ADDR) will be used to denote the data field x from the data record identified by the address ADDR. For example, the previous error value PEV from the data record identified by ADDR is denoted as PEV(ADDR).

If the packet P is a timestamp-bearing packet, the secondary distribution unit 260 may replace the timestamp $n_S$ originally present in the packet with the output timestamp $n_{out}$ provided by the source frequency estimator 270 prior to writing the packet P to the output FIFO $K(n_{CH})$.

As noted above, the source frequency estimator may perform the operations of (a) generating an output timestamp $n_{out}$ and (b) updating the values z(ADDR), $z_1$(ADDR), $z_2$(ADDR), $z_3$(ADDR), PEV(ADDR), DMC(ADDR), Tpts(ADDR) in response to determination that the packet P is valid and that the packet P is a timestamp-bearing packet. If the packet P corresponds to a discontinuity in its packet stream (i.e., $DI_{in}=1$), the set of update operations may be performed as follows.

The output timestamp may be generated by adding the delay count DC to the input timestamp value $n_{in}$ of the packet P, i.e., $$n_{out}=n_{in}+DC. \quad (3)$$

The output timestamp $n_{out}$ is provided to the secondary distribution unit 260.

The values z(ADDR), $z_1$(ADDR), $z_2$(ADDR), $z_3$(ADDR), PEV(ADDR) and DMC(ADDR) may be set equal to zero.

The value $T_{pts}$(ADDR) may be set equal to $CSR\_T_{pts}$, where $CSR\_T_{pts}$ is a value programmed by software based on the MPEG cell size and QAM channel rate.

Packet Valid & Timestamp Present & No Discontinuity

If the packet P does not correspond to a discontinuity in its packet stream (i.e., $DI_{in}=0$), the source frequency estimator may implement the operations (a) and (b) as follows.

The expected timestamp $\hat{n}_S$(ADDR) may be accessed from the memory and provided to the secondary distribution unit 260 as the output timestamp $n_{out}$.

An error value ERR may be computed according to the relation:

$$ERR=n_{in}+DC-\hat{n}_S(ADDR). \quad (4A)$$

An error gradient value dERR may be computed according to the relation:

$$dERR=ERR-PEV(ADDR). \quad (4B)$$

In one set of embodiments, the digital PLL 276 includes filters $F_A$, $F_1$, $F_2$ and $F_3$. The value ERR may be supplied to the filter $F_A$ and the value dERR may be supplied to the filters $F_1$, $F_2$ and $F_3$.

In response to receiving the value ERR, the filter $F_A$ generates a new value for the filter output z according to the relation:

$$z=\alpha \cdot z(ADDR)+\beta \cdot ERR, \quad (5)$$

where α and β are positive constants.

In response to receiving the value dERR, the filter $F_i$, i=1, 2, 3, generates a new filter output value $z_1$ according to the relation:

$$z_1=\alpha_i \cdot z_1(ADDR)+\beta_i \cdot dERR, \quad (6)$$

where $\alpha_i$ and $\beta_i$ are positive constants.

Filter $F_1$ may be tuned for fast tracking into order to perform initial acquisition of the source clock frequency; filter $F_2$ may be tuned for intermediate speed tracking; and filter $F_3$ may be tuned for slower tracking so as to be most immune to variations in the ERR signal due to jitter, but still fast enough to track the drift of the source clock frequency.

The value DMC of the decision multiplexer count DMC (ADDR) may be read from the memory 270 and used to control the computation of a preliminary clock adjustment value PCAV. In particular, the preliminary clock adjustment value PCAV may be computed according to one of the relations:

$$PCAV \leftarrow z+K_1 * z_1, \quad (7)$$

$$PCAV \leftarrow z+K_2 * z_2, \quad (8)$$

$$PCAV \leftarrow z+K_3 * z_3, \quad (9)$$

depending on the relationship of the value DMC to threshold values $N_1$ and $N_2$, where $0<N_1<N_2$. If the value DMC is less than $N_1$, the preliminary clock adjustment value may be determined by relation (7). If the value DMC is greater or equal to $N_1$ but less than $N_2$, the preliminary clock adjustment value may be determined by relation (8). If the value DMC is greater than or equal to $N_2$, the preliminary clock adjustment value may be determined by relation (9). The scaling constants $K_1$, $K_2$ and $K_3$ may be positive and obey the constraints $K_1 > K_2 > K_3$.

The source frequency estimator may include a multiplexer whose data inputs are the values $K_1 * z_1$, $K_2 * z_2$ and $K_3 * z_3$ and whose select input is driven by a control value CV. The control value may equal any of the value $S_1$, $S_2$ and $S_3$. The multiplexer may be configured to select the product $K_i z_1$ when $CV=S_i$, i=1, 2, 3. The source frequency estimator 270 may compare the value DMC to threshold values $N_1$ and $N_2$ to determine the control value CV. If the value DMC is less than $N_1$, the control value CV is set to $S_1$. If the value DMC is greater than or equal to $N_1$ but less than $N_2$, the control value CV is set to $S_2$. If the value DMC is greater than or equal to $N_2$, the control value CV is set to $S_3$. The output q of the multiplexer is supplied to an adder which implements the addition z+q. Thus, the control value CV determines which of the relations (7), (8) or (9) is used to compute the preliminary clock adjustment value PCAV.

Furthermore, a limiting operation may be performed to limit the preliminary clock adjustment value PCAV to one of the intervals $[-c_2, c_2]$, $[-c_3, c_3]$ depending on the state variable value, where $c_1 > c_2 > c_3 > 0$. (The notation [A,B] denotes the closed interval from A to B.) If the control value $CV=S_i$, i=1, 2, 3, the preliminary clock adjustment value PCAV is limited to the interval $[-c_i, c_i]$. In other words, if the control value $CV=S_i$, i=1, 2, 3, the source frequency estimator may generate an intermediate clock adjustment value ICAV according to the expression:

$$ICAV = \begin{cases} -c_i, & \text{if } PCAV < -c_i \\ PCAV, & \text{if } -c_i \leq PCAV \leq c_i \\ c_i, & \text{if } c_i < PCAV \end{cases} \quad (10)$$

If the preliminary clock adjustment value PCAV falls outside the interval $[-c_i, c_i]$, the state machine may set a bit $B_{lost}$ to indicate a loss of lock on the source clock frequency of the packet stream associated with packet P.

A final clock adjustment value FCAV may be computed based on the expression:

$$FCAV = K_0 * ICAV, \quad (11)$$

where $K_0$ is a positive constant. In one set of embodiments, $K_0$ equals $CSR\_T_{pts}/f_{nom}$, where $f_{nom}$ is the nominal frequency of the local clock 212. In one embodiment, $f_{nom}$=27 MHz.

The final clock adjustment value FCAV may be used to update the value Tpts(ADDR) according to the relation:

$$Tpts(ADDR) \leftarrow Tpts(ADDR) + FCAV. \quad (12)$$

If the source frequency estimator has lost its lock on the source clock frequency (i.e., $B_{lost}$=1), the source frequency estimator may: set an output discontinuity indicator $DI_{out}$ for the packet P equal to one (indicating a discontinuity); set the expected timestamp field $\hat{n}_S$(ADDR) equal to the output timestamp $n_{out}$; set the fields z(ADDR), $z_1$(ADDR), $z_2$(ADDR), $z_3$(ADDR), PEV(ADDR) and DMC(ADDR) equal to zero; and set the field $T_{pts}$(ADDR) equal to the value $CSR\_T_{pts}$.

If the source frequency estimator has not lost its lock on the source clock frequency (i.e., $B_{lost}$=0), the source frequency estimator may: set the output discontinuity indicator $DI_{out}$ equal to zero (indicating that no discontinuity has been detected); store the values z, $z_1$, $z_2$, $z_3$ and ERR into the fields z(ADDR), $z_1$(ADDR), $z_2$(ADDR), $z_3$(ADDR) and PEV(ADDR) respectively; and increment the decision multiplexer value DMC(ADDR), i.e., DMC(ADDR)←DMC+1.

In some embodiments, the source frequency estimator may be configured to saturate the decision multiplexor count at some maximum value (e.g., 255). Thus, the source frequency estimator may determine if the value DMC equals the maximum value. If so, the increment operation may be bypassed.

Update Expected Timestamps in View of Next Packet Transmission

As noted above, the source frequency estimator 270 may update the expected timestamp $\hat{n}_S$ for each of the packet streams that are assigned to the output FIFO K(v($n_{CH}$)) in anticipation of the next packet transmission. In particular, the source frequency estimator 270 may include circuitry (e.g., update unit 282) to implement the update according with the following pseudo code:

If (PVI=1) {
For (ii=0; ii<$N_{S/C}$; ii++) {
ADDR=$n_{CH}$*$N_{S/C}$+ii;
$\hat{n}_S$(ADDR)←$\hat{n}_S$(ADDR)+$T_{pts}$(ADDR);}
}

In other words, for each of the $N_{S/C}$ data records that correspond to the output FIFO K(v($n_{CH}$)), the source frequency estimator may increment the expected timestamp value $\hat{n}_S$(ADDR) according to the relation $$\hat{n}_S(ADDR) \leftarrow \hat{n}_S(ADDR) + T_{pts}(ADDR), \quad (13)$$

subject to the condition that the packet P is valid.

FIG. 3: One Embodiment of the Source Frequency Estimator

FIG. 3 illustrates one embodiment of the source frequency estimator 270. The control unit 272 may receive the channel indicator $n_{CH}$, the stream indicator $n_{STR}$, the packet validity indicator PVI and the discontinuity indicator $DI_{in}$ corresponding to the packet P from the secondary distribution unit 260. The control unit 272 may:

generate an enable signal EN1 according to the relation $$EN1 = (n_{in}.neq.0) \& PVI_x$$

where "&" denotes the logical AND operator;
supply the enable signal EN1 and the input discontinuity indicator $DI_{in}$ to the output timestamp generator 274;
compute the address value ADDR according to the relation (1) above;
transfer the address value ADDR to the memory 278; and
in response the condition (($n_{in}$ .neq. 0) & PVI & $DI_{in}$), reinitialize the values z(ADDR), $z_1$(ADDR), $z_2$(ADDR), $z_3$(ADDR), PEV(ADDR) and DMC(ADDR) to zero and reinitialize the value Tpts(ADDR) to $CSR\_Tpts$.

In response to receiving the address value ADDR, the memory 278 accesses the data record corresponding to the address value ADDR. The fields of this data record are supplied to the output TS generator 274, the error calculation unit 275 and the digital PLL 276. The value Tpts and the expected timestamp value $\hat{n}_S$ (ADDR) are supplied to the output timestamp generator. The expected timestamp value $\hat{n}_S$ and the previous error value PEV(ADDR) are supplied to the error calculation unit. The values z(ADDR), $z_1$(ADDR), $z_2$(ADDR), $z_3$(ADDR), DMC(ADDR) and Tpts(ADDR) are supplied to the digital PLL.

The output timestamp generator 274 also receives the packet delay value DEL and the input timestamp $n_{in}$, from the secondary distribution unit 260. In response to a rising edge of the signal EN1, the output timestamp generator 274 may:

compute the delay count DC according to the relation (2), and
generate the output timestamp $n_{out}$ in one of two different ways based on the discontinuity indicator $DI_{in}$;
provide the output timestamp $n_{out}$ to the secondary distribution unit 260.

If the discontinuity indicator $DI_{in}$ is TRUE (indicating a discontinuity), the output timestamp generator 274 may compute the output timestamp $n_{out}$ according to the relation (3). If the discontinuity indicator $DI_{in}$ is FALSE, the output timestamp generator 274 may set the output timestamp $n_{out}$ equal to the expected timestamp $\hat{n}_S$ (ADDR), i.e., $n_{out} \leftarrow \hat{n}_S$(ADDR).

The delay count DC may be provided to the error calculation unit 275. In addition, the output timestamp generator 274 may assert an enable signal EN2 in response to the condition EN1 & (!$DI_{in}$), where "!" denotes the logical NOT operator.

As suggested above, the error calculation unit 275 receives the previous error value PEV(ADDR) and the expected timestamp $\hat{n}_S$(ADDR) from the memory 278. Furthermore, the error calculation unit receives the discontinuity count DC and the error signal EN2 from the output timestamp generator 274 and the input timestamp $n_{in}$ provided by the secondary distribution unit 260. In response to an assertion of the enable signal EN2, the error calculation unit 275 may compute the error value ERR and the error gradient value dERR according to the relations (4A) and (4B) respectively. The error value ERR and error gradient value dERR may be supplied to the digital PLL 276. Furthermore, the error value ERR may be provided to memory 278 in order to update the previous error value PEV(ADDR), i.e., PEV(ADDR)←ERR.

Figure 4:
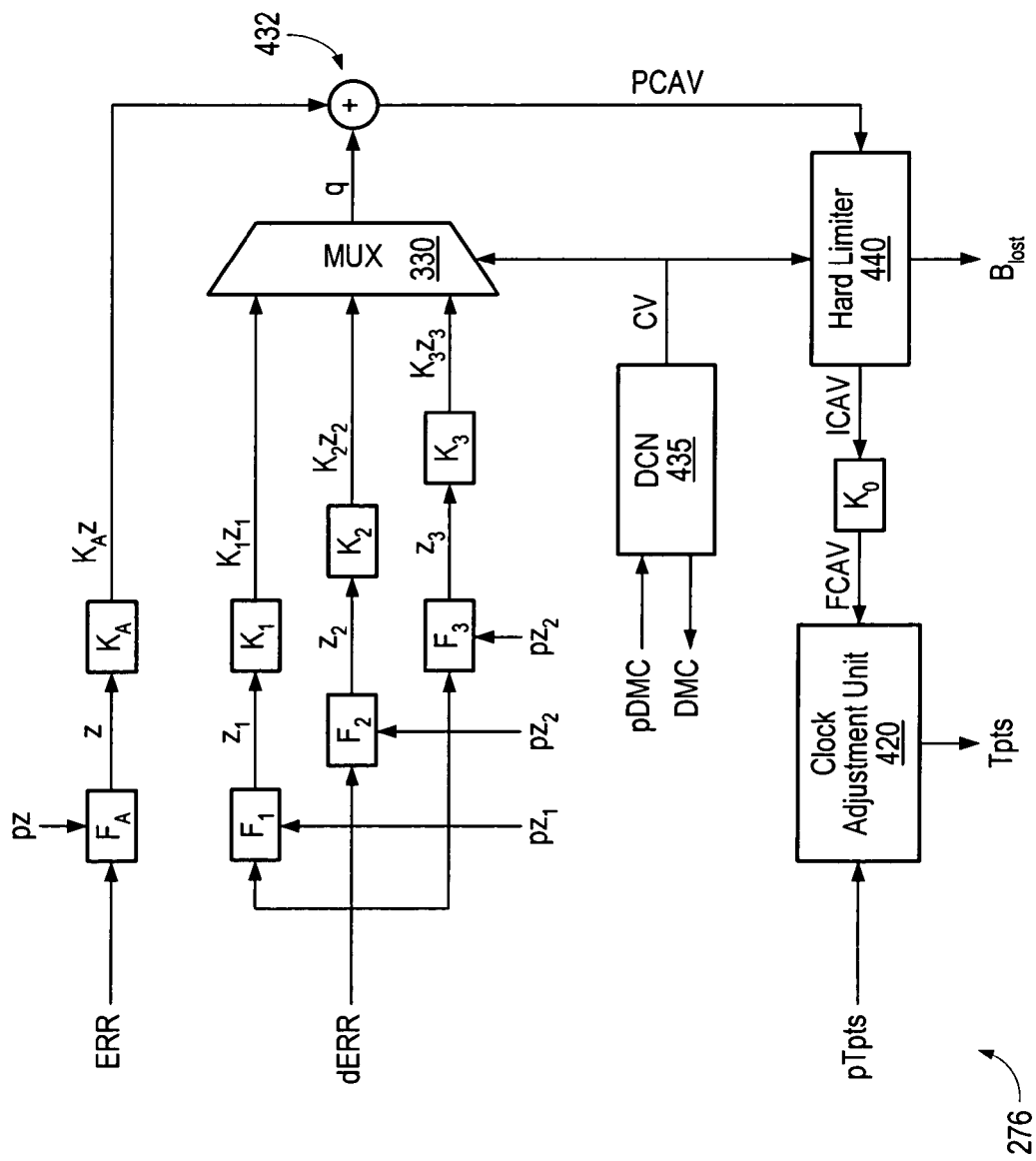
FIG. 4 illustrates one set of embodiments of the digital phase locked loop (PLL).

In response to receiving the error value ERR and the error gradient value dERR from the error calculation unit and the values z(ADDR), $z_1$(ADDR), $z_2$(ADDR), $z_3$(ADDR), DMC(ADDR) and Tpts(ADDR) from memory 278, the digital PLL 276 may compute updated values for z(ADDR), $z_1$(ADDR), $z_2$(ADDR), $z_3$(ADDR), DMC(ADDR) and Tpts(ADDR), e.g., as illustrated in FIG. 4. The updated values are stored back into memory 278, i.e., into the data record corresponding to address value ADDR.

The values z(ADDR), $z_1$(ADDR), $z_2$(ADDR), $z_3$(ADDR), DMC(ADDR) and Tpts(ADDR) supplied from memory 278 are denoted in FIG. 4 with a prefix "p" (to suggest "previously calculated"), i.e., as pz, $pz_1$, $pz_2$, $pz_3$, pDMC and pTpts respectively. The updated values computed by the digital PLL are denoted without prefix, i.e., simply as z, $z_1$, $z_2$, $z_3$, DMC and Tpts.

The error value ERR may be supplied to filter $F_A$. Filter $F_A$ may compute the updated output value z according to the relation $$z = \alpha \cdot pz + \beta ERR.$$

The output value z is supplied to a multiplier which computes the product $K_A z$.

The error gradient value dERR may be supplied to filters $F_1$, $F_2$ and $F_3$. Filter $F_i$, i=1, 2, 3, may compute the filter output value $z_i$ according to the relation:

$$z_i = \alpha_i \cdot pz_i + \beta_i \cdot dERR.$$

Each output value $z_i$, i=1, 2, 3, may be supplied to corresponding multiplier which computes the product $K_i z_i$.

Multiplexer 430 may select one of the products $K_1 z_1$, $K_2 z_2$, $K_3 z_3$ based on the state of the control value CV supplied by the comparator logic network 435 as described above. The selected value q may supplied to adder 432. Adder 432 may also receive product $K_A Z$. Adder 432 computes the preliminary clock adjustment value according to the relation:

$$PCAV \leftarrow K_A Z + q.$$

Hard limiter 440 may compute the intermediate clock adjustment value ICAV by limiting the preliminary clock adjustment value PCAV based on the state of the control value CV as described above.

The decision control network 435 may include a set of comparators and logic gates to perform the comparisons describe above in order to compute the control value CV. The decision control network may also include circuitry to update (and saturate) the decision multiplexer count according to the expression:

$$DMC \leftarrow \begin{cases} pDMC + 1, & \text{if } DMC < 255 \\ 255, & \text{if } DMC = 255 \end{cases}.$$

Furthermore, the decision control network 435 may also assert the $B_{lost}$ bit if the preliminary clock adjustment value PCAV falls outside the interval appropriate for the current state as described above.

The intermediate clock adjustment value ICAV may be supplied to a multiplier in order to compute the final clock adjustment value FCAV according to the expression:

$$FCAV = ICAV * K_0.$$

The clock adjustment unit 420 may receive the final clock adjustment value FCAV and compute the updated value of Tpts according to the relation:

$$Tpts \leftarrow pTpts + FCAV.$$

Optimizations for MPEG-2

In one set of embodiments, the stream multiplexer 110 may be configured to multiplex MPEG-2 transport streams. In one embodiment of this set, the digital PLL 276 is configures so that:

$F_A$ is an IIR filter with $\alpha = 63/64$, $\beta = 1/64$;

$K_A = 1/1024$;

$F_1$ is an IIR filter with $\alpha_1 = 15/16$, $\beta\beta_1 = 1/16$ $K_1 = 1/16$;

$F_2$ is an IIR filter with $\alpha_2 = 63/64$, $\beta_2 = 1/64$;

$K_2 = 1/64$;

$F_3$ is an IIR filter with $\alpha_3 = 255/256$, $\beta_3 = 1/256$;

$K_3 = 1/256$;

$N_1 = 50$ and $N_2 = 250$; and $c_1 = 12$, $c_2 = 3$ and $c_3 = 0.3$.

If the multiplication by $K_A$ is incorporated into the IIR coefficients of filter $F_A$ (instead of being performed after the filter $F_A$), the coefficients of filter $F_A$ may be:

$$\alpha = 63/65536, \beta = 1/65536.$$

Similarly, the constants $K_1$, $K_2$ and $K_3$ may also be incorporated into the coefficients of filters $F_1$, $F_2$ and $F_3$, respectively.

At least a subset of the multiplications may involve scaling by powers of two, and thus, may be implemented by left or right shifting. As noted above, the scaling factors $K_A$, $K_1$, $K_2$, and $K_3$ may be embedded into their respective IIR filter coefficients. It is also possible to embed scaling factor $K_0$ into the coefficients of filters $F_1$, $F_2$ and $F_3$. However, doing so may disrupt the power of two property of many of the coefficients and potentially result in greater complexity.

Figure 5:
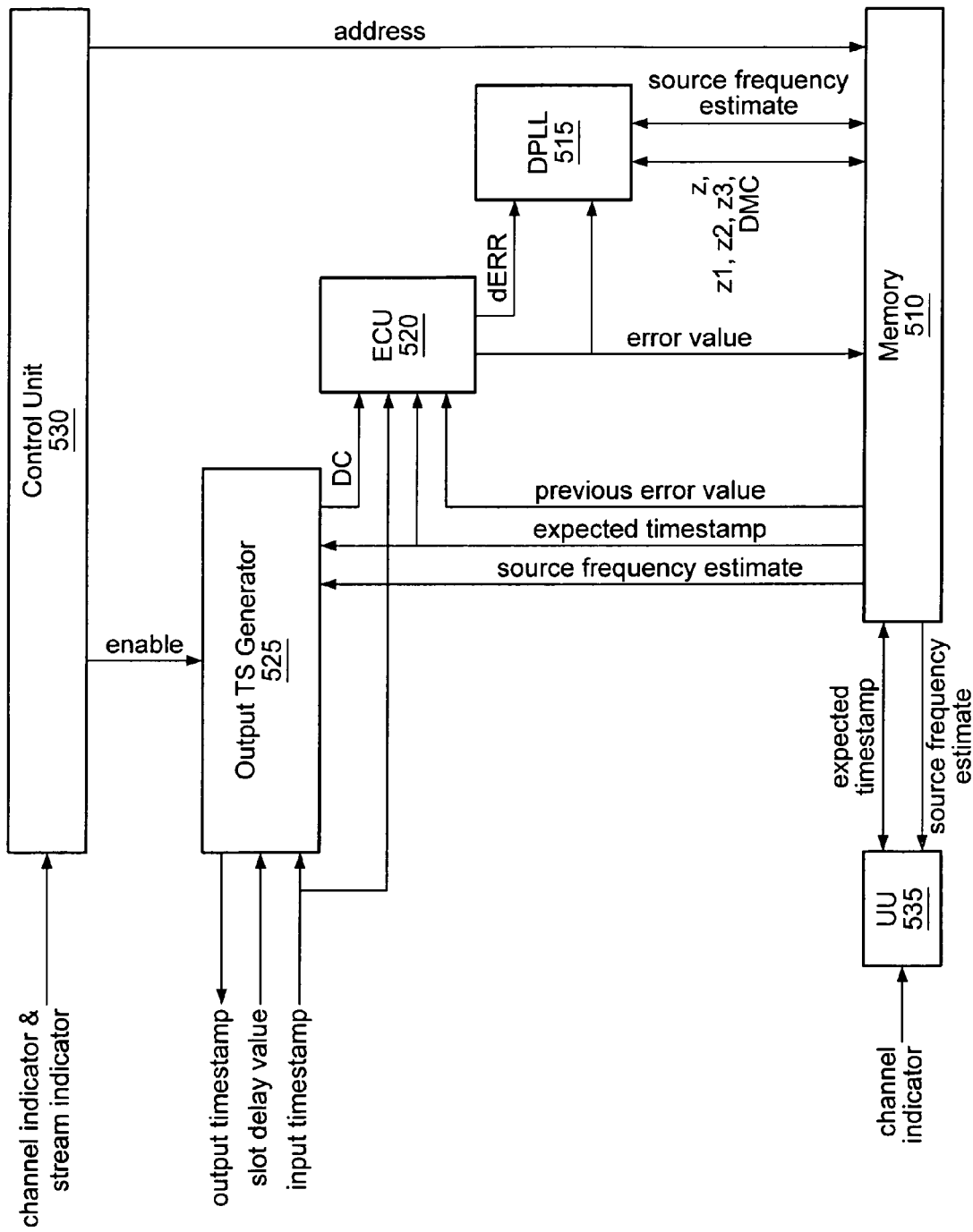
FIG. 5 illustrates one set of embodiments of a system for estimating the source frequencies of packet streams.
Figure 6:
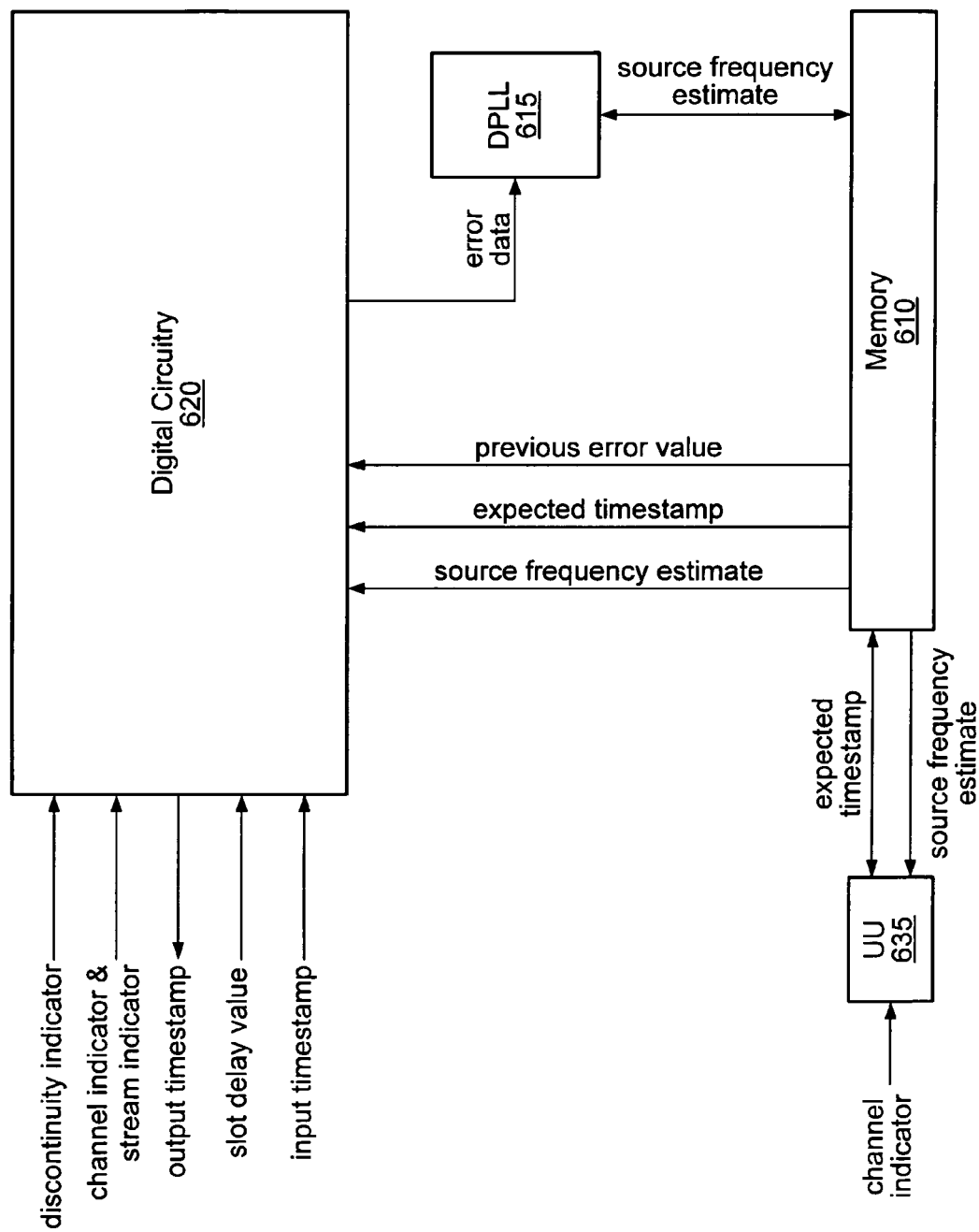
FIG. 6 illustrates another set of embodiments of the system for estimating the source frequencies of packets streams.

In one set of embodiments, a system may include a memory 510, a digital phase-locked loop (PLL) 515, an error calculation unit 520, an output timestamp generator 525 and a control unit 530 as illustrated in FIG. 5. The memory 510 may be configured to store a set of data records. Each of the data records may be allocated to one packet stream in a set of packet streams. The control unit 530 may be configured to:

receive a channel indicator and a stream indicator for a current timestamp-bearing packet, generate an address based on the stream indicator and the channel indicator, and invoke a read operation from the memory 510 based on the address.

The output timestamp generator 525 may be configured to:

(a) generate an output timestamp for the current packet equal to an expected timestamp provided by the memory 510 as part of said read operation, and (b) compute a delay count DC for the current packet based on a previous source frequency estimate provided by the memory 510 as part of said read operation and on a received slot delay value.

The error calculation unit 520 may be configured to generate an error value and an error gradient value dERR based on the delay count, the expected timestamp, an input timestamp and a previous error value provided by the memory 510 as part of said read operation.

The digital PLL 515 may be configured to compute an updated source frequency estimate in response to receiving the error value, the error gradient value and the previous source frequency estimate.

The system may also include an update unit 535. The update unit 535 may be configured to receive a channel indication for each packet in a sequence of packets including the current timestamp-bearing packet. The packets of the sequence belong to the set of packet streams. The update unit 535 may be further configured to perform, for each packet of the sequence of packets, operations including the following:
reading from the memory 510 an expected timestamp and a respective source frequency estimate corresponding to the channel indication, and
updating the expected timestamp based on the respective source frequency estimate.

The error calculation unit 520 may be configured to store the error value in the memory 510 in order to update the previous error value.

The slot delay value may represent a number of packet transmission slots that the packet has been delayed. The output timestamp generator 525 may be configured to compute the delay count by multiplying the slot delay value and the previous source frequency estimate.

As an alternative to (a), the output timestamp generator 525 may be configured to generate the output timestamp by adding the delay count DC to the input timestamp in response to an indication that the current timestamp-bearing packet corresponds to a stream discontinuity.

The digital PLL 515 may include a set of low-pass digital filters that operate on the error value and the error gradient value. The set of digital filters may include:
a first infinite impulse response (IIR) filter that operates on the error value and on a first previous output value provided as part of said read operation, to generate a first updated output value; and
a set of two or more second IIR filters that operate on the error gradient value and on a set of second previous output values provided as part of said read operation, respectively, to generate second updated output values, respectively.

The digital PLL 515 may be configured to compute the updated source frequency estimate by:
selecting one of the second updated output values based on a decision count value DMC;
computing a clock adjustment value based on the first output value and the selected one of the second updated output values; and
adding the clock adjustment value to the previous source frequency estimate.

The decision count value DMC may represent a number of timestamp bearing packets associated with a current packet stream to which the current packet belongs.

The control unit 530 may be configured to reinitialize the data record corresponding to the address in response to a received indication that the current packet corresponds to a stream discontinuity.

The digital PLL 515 may be configured to write the updated source frequency estimate to the memory 510, into the data record corresponding to the address.

In another set of embodiments, a system may include a memory 610, a digital phase-locked loop (PLL) 615 and digital circuitry 620. The memory 610 may be configured to store a set of data records. Each of the data records is allocated to one packet stream in a set of packet streams. The digital circuitry 620 may be configured to:
(a) invoke a read operation from the memory 610 in response to a received stream indicator and received channel indicator corresponding to a current timestamp-bearing packet;
(b) generate an output timestamp for the current packet equal to an expected timestamp provided by the memory 610 as part of said read operation; and
(c) generate error data based on first data including a received input timestamp, a received slot delay value, a previous source frequency estimate and an expected timestamp provided by the memory as part of said read operation.

The digital PLL 615 may be configured to compute an updated source frequency estimate based on information including the error data and the previous source frequency estimate.

The system may also include an update unit 635. The update unit 635 may be configured to receive a channel indication for each packet in a sequence of packets including the current timestamp-bearing packet. The packets of the sequence belong to the set of packet streams. The update unit 635 may be further configured to perform, for each packet of the sequence of packets, operations including the following:
reading from the memory 610 an expected timestamp and a respective source frequency estimate corresponding to the channel indication, and
updating the expected timestamp based on the respective source frequency estimate.

The digital circuitry 620 may be configured to alternatively generate (i.e., as an alternative to (b)) the output timestamp by adding a delay count to the input timestamp in response to an indication that the current timestamp-bearing packet corresponds to a stream discontinuity. The delay count may be computed as a product of the expected timestamp and the slot delay value.

The digital PLL 615 may include a set of one or more low-pass digital filters.

The error data may include an error value ERR and an error gradient value dERR, and, the first data may also include a previous error value provided by the memory 610 as part of said read operation.

The set of digital filters may include:
a first infinite impulse response (IIR) filter that operates on the error value and on a first previous output value provided as part of said read operation, to generate a first updated output value; and
a set of two or more second IIR filters that operate on the error gradient value and on a set of second previous output values provided as part of said read operation, respectively, to generate second updated output values, respectively.

The digital PLL 615 may be configured to compute the updated source frequency estimate by:
selecting one of the second updated output values based on a decision count value;
computing a clock adjustment value based on the first output value and the selected one of the second updated output values;
adding the clock adjustment value to the previous source frequency estimate.

In yet another set of embodiments, a computational method may be organized as follows as illustrated in FIG. 7.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or CD-ROM, volatile or non-volatile media such as RAM (e.g. SDRAM, DDR SDRAM, RDRAM, SRAM, etc.), ROM, etc. as well as transmission media or signals such as electrical, electromagnetic, or digital signals, conveyed via a communication medium such as a network and/or a wireless link.

The various methods as illustrated in the Figures and described herein represent exemplary embodiments of methods. The methods may be implemented in software, hardware, or a combination thereof. The order of method steps may be changed, and various steps may be added, reordered, combined, omitted, modified, etc.

Various modifications and changes may be made as would be obvious to a person skilled in the art having the benefit of this disclosure. It is intended that the invention embrace all such modifications and changes and, accordingly, the above description is to be regarded in an illustrative rather than a restrictive sense.

What is claimed is:

1. A system comprising:
    a memory configured to store a set of data records, wherein each of the data records is allocated to one packet stream in a set of packet streams;
    a digital phase-locked loop (PLL);
    an error calculation unit;
    an output timestamp generator; and
    a control unit configured to receive a channel indicator and a stream indicator for a current timestamp-bearing packet, generate an address based on the stream indicator and the channel indicator, and invoke a read operation from the memory based on the address,
    wherein the output timestamp generator is configured to (a) generate an output timestamp for the current timestamp-bearing packet equal to an expected timestamp provided by the memory as part of said read operation and (b) compute a delay count for the current timestamp-bearing packet based on a previous source frequency estimate provided by the memory as part of said read operation and on a received slot delay value;
    wherein the error calculation unit is configured to generate an error value and an error gradient value based on the delay count, the expected timestamp, an input timestamp and a previous error value provided by the memory as part of said read operation;
    wherein the digital PLL is configured to compute an updated source frequency estimate in response to receiving the error value, the error gradient value and the previous source frequency estimate.

2. The system of claim 1, further comprising an update unit configured to receive a channel indication for each packet in a sequence of packets including the current timestamp-bearing packet, wherein the packets of said sequence belong to the set of packet streams, wherein the update unit is further configured to perform, for each packet of the sequence of packets, operations including the following:
    reading from the memory an expected timestamp and a respective source frequency estimate corresponding to the channel indication, and
        updating the expected timestamp based on the respective source frequency estimate.

3. The system of claim 1, where the error calculation unit is configured to store the error value in the memory in order to update the previous error value.

4. The system of claim 1, wherein the current timestamp-bearing packet belongs to a first of the packet streams, wherein the address points to a data record corresponding to the first packet stream.

5. The system of claim 1, wherein the slot delay value represents a number of packet transmission slots that the packet has been delayed, wherein the output timestamp generator is configured to compute the delay count by multiplying the slot delay value and the previous source frequency estimate.

6. The system of claim 1, wherein the output timestamp generator is configured to alternatively generate the output timestamp by adding the delay count to the input timestamp in response to an indication that the current timestamp-bearing packet corresponds to a stream discontinuity.

7. The system of claim 1, wherein the digital PLL includes a set of low-pass digital filters that operate on the error value and the error gradient value.

8. The system of claim 7, wherein the set of digital filters includes:
    a first infinite impulse response (IIR) filter that operates on the error value and on a first previous output value provided as part of said read operation, to generate a first updated output value; and
    a set of two or more second IIR filters that operate on the error gradient value and on a set of second previous output values provided as part of said read operation, respectively, to generate second updated output values, respectively.

9. The system of claim 8, wherein the digital PLL is configure to compute the updated source frequency estimate by:
    selecting one of the second updated output values based on a decision count value;
    computing a clock adjustment value based on the first output value and the selected one of the second updated output values;
    adding the clock adjustment value to the previous source frequency estimate.

10. The system of claim 7, wherein the decision count value represents a number of timestamp bearing packets associated with a current timestamp-bearing packet stream to which the current timestamp-bearing packet belongs.

11. The system of claim 1, wherein the control unit is configured to reinitialize the data record corresponding to the address in response to a received indication that the current timestamp-bearing packet corresponds to a stream discontinuity.

12. The system of claim 1, wherein the digital PLL is configured to write the updated source frequency estimate to the memory, into the data record corresponding to the address.

13. A system comprising:
    a memory configured to store a set of data records, wherein each of the data records is allocated to one packet stream in a set of packet streams;
    a digital phase-locked loop (PLL); and
    digital circuitry configured to:
        invoke a read operation from the memory in response to a received stream indicator and received channel indicator corresponding to a current timestamp-bearing packet, wherein the channel indicator identifies one of a plurality of output channels of the system;
        generate an output timestamp for the current timestamp-bearing packet equal to an expected timestamp provided by the memory as part of said read operation; and
        generate an error value and an error gradient value based on first data that includes including a received input timestamp, a received slot delay value, the expected timestamp and a previous source frequency estimate also provided by the memory as part of said read operation;
    where the digital PLL is configured to compute an updated source frequency estimate based on information including the error value, the error gradient value and the previous source frequency estimate.

14. The system of claim 13, further comprising an update unit configured to receive a channel indication for each packet in a sequence of packets including the current timestamp-bearing packet, wherein the packets of said sequence belong to the set of packet streams, wherein the update unit is further configured to perform, for each packet of the sequence of packets, operations including the following:
- reading from the memory an expected timestamp and a respective source frequency estimate corresponding to the channel indication, and
- updating the expected timestamp based on the respective source frequency estimate.

15. The system of claim 13, wherein the digital logic is configured to alternatively generate the output timestamp by adding a delay count to the input timestamp in response to an indication that the current timestamp-bearing packet corresponds to a stream discontinuity, wherein the delay count is a product of the expected timestamp and the slot delay value.

16. The system of claim 13, wherein the received input timestamp is a timestamp that was originally present in the current timestamp-bearing packet as that packet was received by the system, the system further comprising a distribution unit configured to:
- generate a modified packet by replacing the received input timestamp in the current timestamp-bearing packet with the output timestamp; and
- transmit the modified packet onto the output channel identified by the channel indicator.

17. The system of claim 13, wherein the digital PLL includes a set of one or more low-pass digital filters, wherein the first data also includes a previous error value provided by the memory as part of said read operation.

18. The system of claim 17, wherein the set of digital filters includes:
- a first infinite impulse response (IIR) filter that operates on the error value and on a first previous output value provided as part of said read operation, to generate a first updated output value; and
- a set of two or more second IIR filters that operate on the error gradient value and on a set of second previous output values provided as part of said read operation, respectively, to generate second updated output values, respectively.

19. The system of claim 18, wherein the digital PLL is configured to compute the updated source frequency estimate by:
- selecting one of the second updated output values based on a decision count value;
- computing a clock adjustment value based on the first output value and the selected one of the second updated output values;
- adding the clock adjustment value to the previous source frequency estimate.

20. A system comprising:
- a first means for storing data, wherein said first means is configured to store a set of data records, wherein each of the data records is allocated to one packet stream in a set of packet streams;
- a second means for achieving a phase lock condition between digital signals;
- a third means for invoking a read operation from the first means in response to a received stream indicator and received channel indicator corresponding to a current timestamp-bearing packet;
- a fourth means for generating an output timestamp for the current timestamp-bearing packet equal to an expected timestamp provided by the first means as part of said read operation; and
- a fifth means for generating an error value and an error gradient value based on first data including a received input timestamp, a received slot delay value, a previous source frequency estimate and the expected timestamp provided by the first means as part of said read operation;
- where the phase locking means is configured to compute an updated source frequency estimate based on information including the error value, the error gradient value and the previous source frequency estimate.

* * * * *